United States Patent [19]
Hollingsworth

[11] 4,253,162
[45] Feb. 24, 1981

[54] BLOCKED SOURCE NODE FIELD-EFFECT CIRCUITRY

[75] Inventor: Richard J. Hollingsworth, Princeton, N.J.

[73] Assignee: RCA Corporation, New York, N.Y.

[21] Appl. No.: 70,509

[22] Filed: Aug. 28, 1979

[51] Int. Cl.³ .................... G11C 11/40; H01L 29/78
[52] U.S. Cl. ................................. 365/175; 307/238; 365/156; 365/176; 365/189; 357/23; 357/4
[58] Field of Search ............... 365/156, 174, 175, 189, 365/22, 23, 33; 307/238

[56] References Cited
U.S. PATENT DOCUMENTS

| | | | |
|---|---|---|---|
| 3,958,266 | 5/1976 | Athans | 357/23 |
| 4,053,916 | 10/1977 | Cricchi et al. | 365/174 |
| 4,063,225 | 12/1977 | Stewart | 365/156 |
| 4,075,690 | 2/1978 | Oberman et al. | 365/156 |

*Primary Examiner*—Terrell W. Fears
*Attorney, Agent, or Firm*—Samuel Cohen; Henry I. Schanzer

[57] ABSTRACT

A unidirectional conducting element is series connected between an input terminal and the source electrode of an insulated-gate field-effect transistor (IGFET) having an electrically floating substrate. The unidirectional conducting element is poled to conduct in a direction which is opposite to the forward direction of the source-to-substrate junction in order to isolate the substrate of the IGFET and its associated capacitance from a signal source connected to the input terminal. The invention is particularly useful in high density, high speed, random access memories (RAMs) to prevent the loading of bit lines by non-selected memory cells.

15 Claims, 11 Drawing Figures

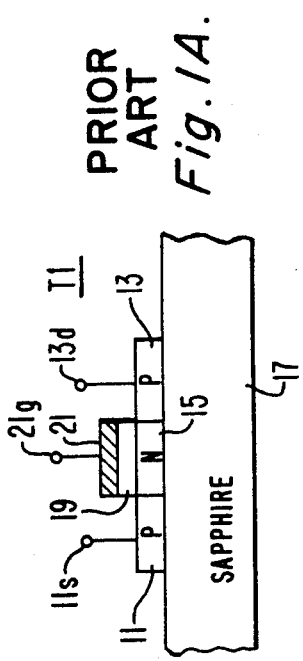
PRIOR ART Fig. 1A.
PRIOR ART Fig. 1B.
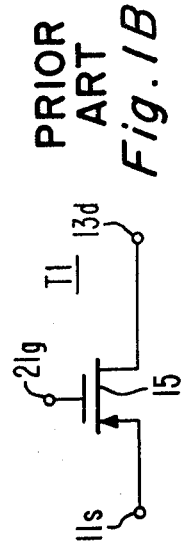
PRIOR ART Fig. 1C.
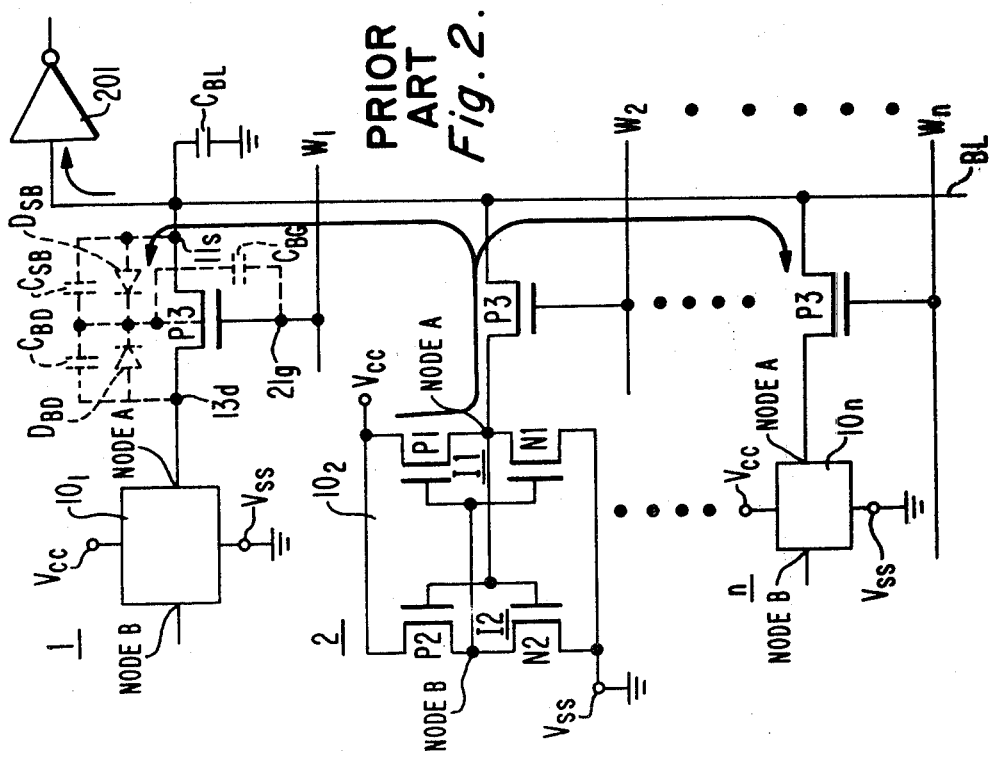
PRIOR ART Fig. 2.

BLOCKED SOURCE NODE FIELD-EFFECT CIRCUITRY

This invention relates to insulated-gate field-effect transistors (IGFETs) having an electrically floating substrate and, in particular, to means for blocking the flow of conventional current through the forward biased source-to-substrate junctions of these IGFETs when they are turned off.

In the accompanying drawings like reference characters denote like components; and FIG. 1A is a cross sectional view of a known IGFET formed on a sapphire substrate;

FIG. 1B is a schematic representation of the circuit of FIG. 1A;

FIG. 1C is a schematic representation of parasitic elements associated with the transistor of FIGS. 1A and 1B in the OFF condition;

FIG. 2 is a schematic representation of a prior art random access memory (RAM);

Figure 3:
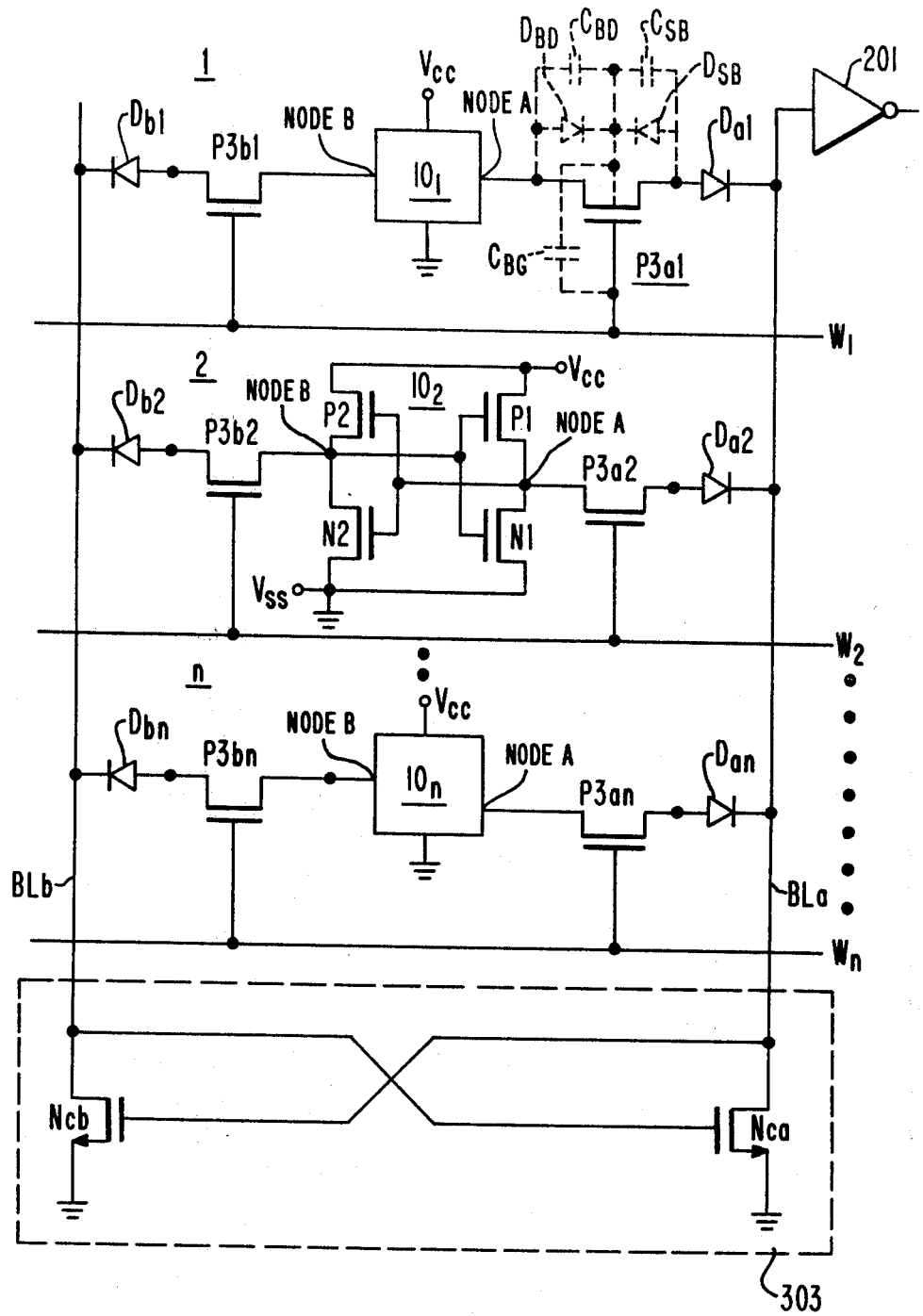
FIG. 3 is a schematic representation of a RAM embodying the invention.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude then a given value, which is defined as the threshold voltage ($V_T$) of the transistor. To turn on a P type transistor its gate voltage ($V_G$) has to be more negative than its source voltage ($V_S$) by at least $V_T$. To turn on a N type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{CC}$ or $+V$ volts is arbitrarily defined as a logic "1" or "high" condition.

A problem recognized by applicant, associated with IGFETs having a floating substrate, is best explained by first referring to FIGS. 1A, 1B and 1C. FIG. 1A shows the cross section of a P-channel IGFET (T1) formed on a sapphire (insulator) base 17. The IGFET includes a source region 11 and a drain region 13 of P-conductivity type separated by a substrate region 15 of N-conductivity type. In the discussion to follow, the term "substrate" refers to the region between the source and drain of a transistor. There is no fixed potential directly applied to the substrate 15. This is typical of an IGFET formed on an insulator (sapphire) base. The substrate 15 can, therefore, float and assume a wide range of values depending on the potentials applied to the source or drain regions. When T1 is turned on, a conduction channel (inversion layer) is formed along the top surface of N region 15 between the source and drain regions. The portion of N region 15 underlying the conduction channel then acts as the local substrate of the transistor. When T1 is turned off, all of region 15 acts as the substrate of transistor T1. Overlying region 15 is an insulator (e.g. oxide) layer 19 over which is formed a gate electrode 21 of conductive material. The gate, source and drain regions are, respectively, accessed by means of gate electrode 21g, source electrode 11S and drain electrode 13d. FIG. 1B schematically illustrates the transistor whose structural details are shown in FIG. 1A.

When transistor T1 is operated as a turned off transmission gate, it may be represented as shown in FIG. 1C. The source-to-substrate junction of T1 forms a PN diode ($D_{SB}$) poled to conduct current from the source node 11S into the substrate (B) region 15 and the drain-to-substrate junction forms a PN diode ($D_{BD}$) poled to conduct current from the drain node 13d into substrate region 15. Associated with diodes $D_{SB}$ and $D_{BD}$ are capacitances $C_{SB}$ and $C_{BD}$, respectively. Capacitance ($C_{BG}$) represents the capacitance between the substrate region 15 and the gate 21 of T1. In practice $C_{BG}$ is considerably larger than the diode capacitance. Typically, $C_{BG}$ may be on the order of 0.5 pf (picofarad) and $C_{BD}$ or $C_{SB}$ may be on the order of 0.05 pf.

The parasitic elements cause a serious problem which is best described by assuming the substrate to be at, or close to, 0 volts. This condition exists if, when T1 was last turned on, a zero voltage level signal was passed via its conduction path and T1 was then (and remains) turned off. To complete the explanation, assume that a load $R_L$ (which may be a passive or an active load) is connected between drain electrode 13d and ground and that a signal source 5 with a source impedance $R_i$ is connected to source electrode 11S. Assume now that a signal going positive from 0 volts to $V_{CC}$ volts is applied to source electrode 11S with T1 still OFF. Diode $D_{SB}$ is then forward biased (shorting out $C_{SB}$) and provides a low impedance path between the signal source 5 and substrate 15 at which is present the parasitic capacitances $C_{BD}$ and $C_{BG}$. Although $C_{BD}$ and $C_{BG}$ are very small, they represent an alternating current (A.C.) impedance between region 15 and ground, loading down the signal source 5 which must supply a displacement current until region 15 is charged to $V_{CC}$ volts. [Actually, $V_{CC} - V_F$, where $V_F$ is the forward voltage drop of diode $D_{SB}$ where $V_F$ is typically 0.6 volts]. Thus, although T1 is turned off, $C_{BD}$ and $C_{BG}$ load down positive going signals which are coupled from the source to the substrate.

Therefore, a problem exists with transistors (or devices) of the type formed on an insulating base or those having a substrate which is not clamped to a potential sufficiently high to maintain the source-to-substrate diode reverse biased. The substrate floats and its associated capacitances (e.g. $C_{BD}$ and $C_{BG}$) load down the signal source connected to the source electrode. The problem becomes acute when the capacitances of many transistors are effectively connected in parallel as illustrated in FIG. 2.

FIG. 2 shows three of N identical memory cells of a column of a memory array formed on an insulating base such as sapphire. As detailed for cell 2 each cell includes a storage element 10 and a gating transistor (also referred to herein as a "pass" transistor) P3. The storage element includes two cross-coupled inverters I1 and I2. Inverter I1 includes transistors P1 and N1 and inverter I2 includes transistors P2 and N2. The sources of N1 and N2 are connected to a point of reference potential indicated as circuit ground and the sources of P1 and P2 are connected to a point of positive operating potential indicated as $V_{CC}$ volts. The drains of P1 and N1 are connected to each other and to the gates of P2 and N2 at node A which defines one input-output point of the storage element 10. In a similar manner the drains of P2 and N2 are connected to each other and to the gates of P1 and N1 at node B which defines the other input-output point of the element 10. The conduction path of a transistor P3 is connected between Node A of each cell and a bit line BL. To aid the visualization of the problem the parasitic elements associated with a "pass" transistor are detailed for transistor P3 of cell number 1.

Assume that: (1) cell #2 is storing a "1" (i.e. node A of cell #2 is "high") while all the other cells of the column are storing "0's" (i.e. each one of their respective node A is "low"), their transistor N1 being ON and clamping their respective node A to ground; (2) prior to the read-out of a selected cell, the bit line BL and its associated capacitance $C_{BL}$ are charged to zero volts; (3) A sense amplifier 201 connected at its input to bit line BL has a capacitive input and senses the voltage on the bit line. For the amplifier 201 to sense the "1" stored in a selected memory cell the bit line voltage must rise above $V_{CC}/2$; and (4) cell #2 is selected for read out by driving word line W2 to ground and thereby turning on P3 of cell #2. Concurrently, all the other word lines are held at $V_{CC}$ maintaining all their associated "pass" transistors turned off.

When P3 of cell #2 is turned on with the cell storing a "1", a current flows from $V_{CC}$ via P1 and P3 of cell #2 into BL. The pass transistors P3 of all the other cells of the column are turned off and their node A is at ground. However, as the bit line voltage rises above zero volts, the source-to-substrate diodes $D_{SB}$ of all the other cells conduct in the forward direction and effectively couple the capacitance associated with the floating substrate of each P3 transistor, to the bit line. The $C_{BD}$ and $C_{BG}$ capacitances of all the pass transistors are thus effectively connected in parallel and have to be charged up to, or close to, $V_{CC}$. The charging current can only come from transistor P1 of cell "2", which is, therefore, heavily loaded. The time to charge the bit line until it reaches a potential above $V_{CC}/2$ is dependent on the capacitance associated with the bit line, which capacitance is a function of the number of cells of the column storing a "0". Therefore, the capacitance associated with the floating substrate renders the sensing of the memory pattern sensitive. That is, the read-out of a selected cell is affected by the pattern stored in other cells of the array. This problem is very significant in large memory arrays as all, none, or any intermediate number, of the cells of a column may be storing "0". This means that the size of the capacitance which must be charged before the threshold of the sense amplifier is reached can vary over a wide range and the time to read-out the contents of a selected cell correspondingly can vary over a wide range. In addition, for the worst case condition (all "0's" in the non-selected cells) the time needed to correctly read-out the contents of a memory cell may be too long, that is, the read period required will be longer than can be tolerated for high speed memory operation.

Applicant's invention resides, in part, in the discovery of the reasons for the pattern sensitivity problem described above and, in part, in the means for blocking the loading effect of the capacitance associated with the floating substrate of an IGFET having a source region forming a PN junction with its substrate. In circuits embodying the invention, a unidirectional conducting element poled to conduct in the opposite direction to the source-to-substrate junction is connected in series with the source to block the passage of current through a forward biased source-to-substrate junction, thereby preventing the floating substrate from loading a signal source connected to the source region.

In the circuit of FIG. 3 a diode ($Dai$ and $Dbi$) is connected in series with the conduction path of each "pass" transistor between the source region of each "pass" transistor and a bit line. The diode is poled to block conduction between the source and the floating substrate whereby the capacitance associated with the floating substrate is isolated from the bit line.

FIG. 3 depicts one column of a memory array of cells. The array includes N rows with each row corresponding to a word of the memory array, and one word line (W$i$) per row. Each memory cell includes a storage element 10 of the type described in FIG. 2, two gating transistors P3$ai$ and P3$bi$, two diodes D$ai$ and D$bi$, where $1 \leq i \leq n$, and two bit lines BL$a$ and BL$b$.

Diode D$ai$ is connected in series with the conduction path of transistor P3$ai$ between node A and bit line BL$a$. Diode D$ai$ is poled to block current flow from bit line BL$a$ into the source of P3$ai$ is connected in series with the conduction path of transistor P3$bi$ between node B and bit line BL$b$, and is poled to block current flow from BL$b$ into the source of P3$bi$. The control (gate) electrodes of P3$ai$ and P3$bi$ are connected to word line W$i$. The parasitic elements associated with each of the pass transistors are only detailed for transistor P3$ai$.

As explained in connection with FIG. 2, when a cell stores a "0", node A is at, or close to, zero volts while node B is at, or close to $V_{CC}$ volts, with transistors N1 and P2 being ON and transistors N2 and P1 being OFF. When a cell stores a "1" node A is at, or close to, $V_{CC}$ volts while node B is at, or close to, 0 volts, with transistor P1 and N2 being ON and transistors P2 and N1 being OFF. Also, in a manner similar to the operation of FIG. 2, when a memory cell is not selected its word line is clamped to $+V_{CC}$ volts. The gating transistors (P3a and P3b) of the non-selected cells are turned-off and the storage element 10 is electrically isolated from bit lines BLa and BLb. When a memory cell is selected, its word line is clamped to ground potential and its associated gating transistors are then turned on.

Assume that, cell #2 is storing a "1" while all the other cells of the column are storing "0's"; and that cell #2 is selected for read-out by driving W2 to ground while all the other word lines are held at $V_{CC}$ volts. Transistors P3a and P3b of cell #2 are turned on. Since cell #2 is storing a "1", its node A is "high" and transistors P1 and P3a of cell #2 are turned on enabling current to pass via their conduction paths and diode Da2, which is then forward biased, into bit line BLa charging the line towards $V_{CC}$ volts. As the potential on BLa increases, an increasing potential is applied to the cathodes of the diodes Dai. This has the effect of applying an increasing reverse bias potential to the diodes Dai of every cell other than cell #2. The diodes Dai block the flow of current from the bit line and prevent current flow via the source-to-substrate junctions of the non-selected pass transistors. Therefore, bit line BLa is isolated from the capacitance associated with the floating substrates of the pass transistors of the non-selected cells.

Since node A of cell #2 is assumed to be "high", its node B is "low". Therefore, transistor P3b2, which is turned on, holds the anode of diode Db2 at, or close to, ground potential. Db2 prevents the clamping of line BLb to ground. Accordingly, the potential on line BLb will be floating, remaining at or close to the potential at which BLb was set prior to the initiation of the read out cycle. The decoupling diode, (e.g. Db2) thus prevents or blocks the "sourcing" of current by its associated gating transistor (P3b2) when the associated output node (e.g. node B) of the storage element is "low". To prevent the floating of the bit lines and to ensure high speed of response, a clamping network 303 is connected across the bit lines. The clamping network includes two cross coupled transistors NCa and NCb. The conduction path of NCa is connected between bit line BLa and ground and the conduction path of NCb is connected between bit line BLb and ground. The gate electrode of transistor NCa is connected to bit line BLb while the gate electrode of NCb is connected to bit line BLa. Thus, whenever a bit line (e.g. BLa goes positive, it turns on the clamping transistor (e.g. NCb) whose conduction path is connected between the other bit line (e.g. BLb) and ground. The other bit line is then clamped to ground potential. That, in turn, ensures the turn off of the clamping transistor (e.g. NCa) whose conduction path is connected at one end to the bit line (e.g. BLa) to which a "high" is applied. The clamping transistors are cross-coupled (employ regenerative feedback) whereby the bit line tending to float is clamped to ground quickly and effectively.

Figure 4:
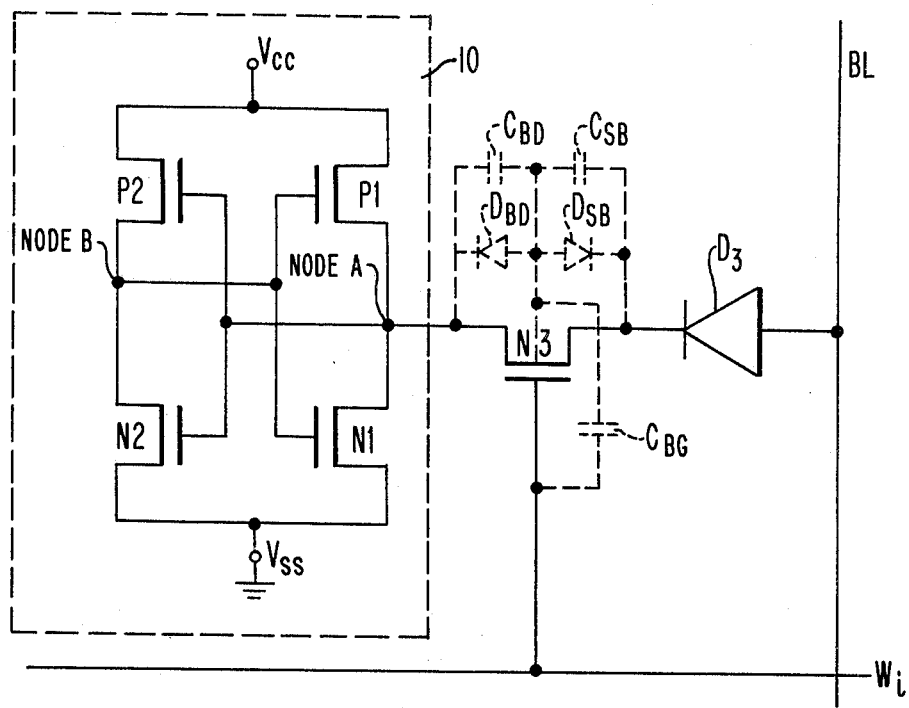
FIGS. 4 and 5 are schematic diagrams of memory cells coupled to a bit line in accordance with the invention.

In FIG. 4 a blocking diode D3 is connected in series with a pass transistor of N-conductivity type between bit line BL and node A of a storage element 10.

Transistor N3 has parasitic elements ($D_{SB}$, $D_{BD}$, $C_{SB}$, $C_{BD}$ and $C_{BG}$) associated with it which correspond to the parasitic elements associated with transistors P3 and T1 described. But, the $D_{SB}$ and $D_{BD}$ diodes of N3 are poled in opposite directions to those of P3 due to the difference in conductivity type.

The source and drain regions of the N type transistor are of N conductivity while its substrate is of P conductivity type. For a transistor of N conductivity type the source-to-substrate junction becomes forward biased when the source (an N region) goes negative with respect to the substrate (a P region). Thus, if in FIG. 1 the P3 transistors are replaced by transistors of N conductivity type the worst case loading occurs when the selected cell is storing a zero and all the non-selected cells are storing a "1". The selected cell would then have to discharge, via its N1 transistor, the positive charge stored at the substrate of all the non-selected cells. For, as soon as the sources of the non-selected pass transistors would go negative with respect to the $V_{CC}$ volt at their substrates, their $D_{SB}$'s would become forward biased. To block the parasitic conduction a diode D3 is connected in series with the conduction path of transistor N3 between node A and a bit line as shown in FIG. 4. It is evident, as shown on FIG. 4 that diode D3 is poled to conduct in the opposite direction to diode $D_{SB}$ of transistor N3. Hence, diode D3 blocks the flow of current from the substrate via the forward conduction path of $D_{SB}$. The diode is poled to enable node A to "sink" current from the bit line, but blocks flow of current from node A to the bit line (hence, it will not "source" current). Hence, the parasitic current cannot flow from the substrate into the bit line, when the bit line goes negative with respect to the substrate.

A problem with the circuit of FIG. 4 is that in order to write a "low" into the cell, current has to be drawn through D3 in the reverse (blocking) direction. This problem can be overcome by making D3 of the type which breaks down at a relatively low reverse breakdown (e.g. 5.5 volts) and applying a reverse potential of sufficient amplitude to the bit line to insure the reverse breakdown of the diode.

Alternatively a sixth, "pass", transistor with its associated diode may be added between node B and a complementary bit line with the resultant operation being similar to that described for FIG. 3.

Figure 5:
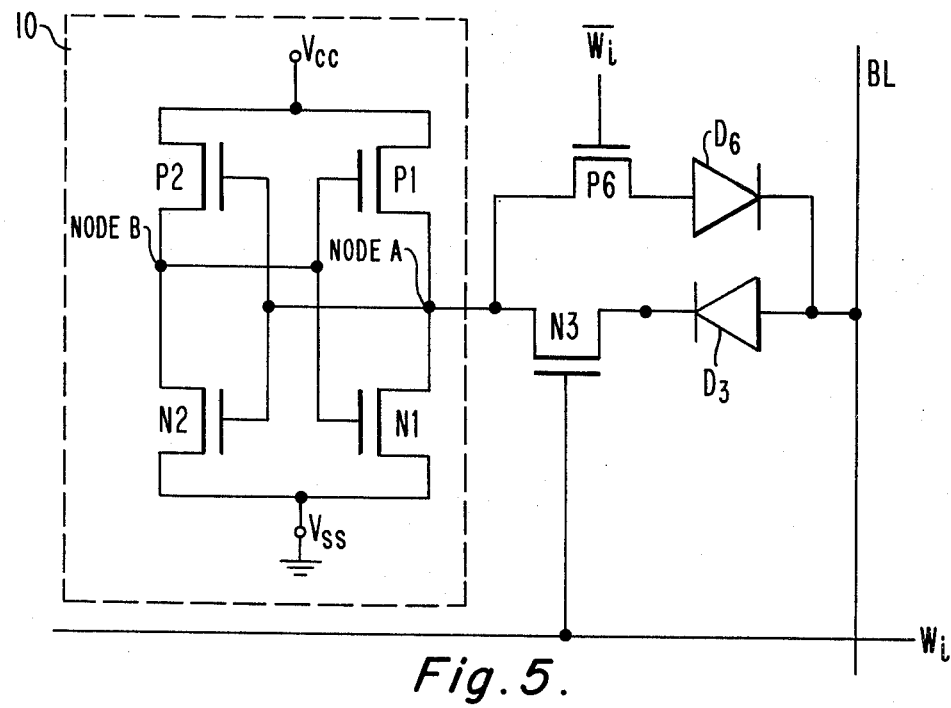

The problem of writing a "low" into the cell, or reading a "high" from the cell, shown in FIG. 4 may be resolved as shown in FIG. 5. In FIG. 5 the conduction path of a transistor P6 is connected in series with a diode D6, in parallel with N3 and D3, between node A and bit line BL. Diode D6 is poled to block the flow of conventional current from BL into the source node of transistor P6. A word line is connected to the gate electrode of transistor P6 to which is applied the complement (Wi) of the signal applied to word line Wi. Consequently, when a "high" signal is to be written into the memory cell, transistor N3 and diode D3 provide the necessary conduction path; when a "low" signal is to be written into the memory cell transistor P6 and diode D6 provide the necessary conduction path. Similarly, during a read cycle, transistor N3 and diode D3 function to couple the low at node A to bit line BL while transistor P6 and diode D6 function to couple a high at node A onto BL. Thus, the memory cell is operable for all the read and write conditions while blocking or isolating the substrate capacitances of the transistors from loading whatever driving source is coupled to the bit line.

Although the invention is illustrated for transistors formed on an insulator substrate such as sapphire, it should be evident that the invention is also applicable to transistors formed on bulk silicon, where the substrate (e.g. the bulk material) is allowed to float.

Although reference is made to blocking the source node it should be recalled that the source and drain electrodes of an IGFET are interchangeable as noted above.

Referring to FIG. 2, by way of example, note that to write a zero into memory cell #1, its electrode 11S must have functioned as the drain and its electrode 13d must have functioned as the source. Subsequently, when a "1" is read-out from another cell onto the bit line electrode 11S of cell #1 functions as the source electrode since its potential is rising and positive with respect to electrode 13d.

The decoupling, (blocking or isolating) diodes shown in FIGS. 3, 4 and 5 may be of the PN junction type or of the Schottky type.

Figure 6A:
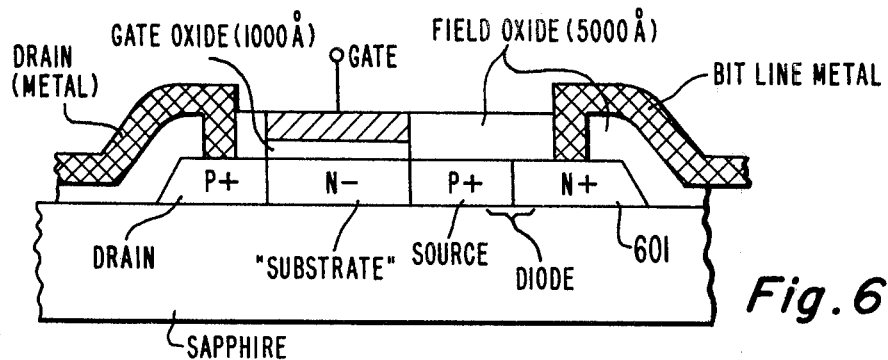
FIGS. 6A and 6B are cross sectional representation and a top view respectively of a PNP IGFET in series with a PN diode which may be used to practice the invention.
Figure 6B:
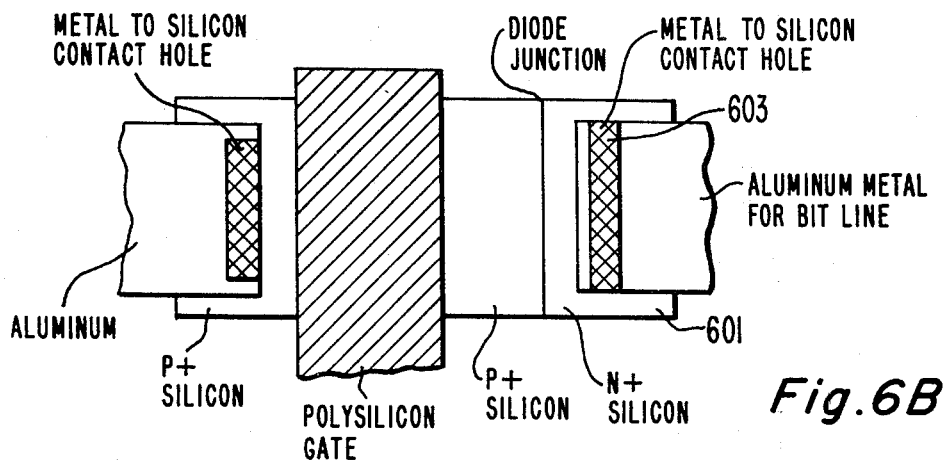

A PN junction type diode may be formed by a diffusion of the type opposite to that of the source-drain of the "pass" transistor in the area immediately surrounding the bit line (metal) contact. In the case of the P type IGFET, this means designing in the photomask as shown in FIGS. 6A and 6B an N+ diffusion 601 which surrounds the area of the metal contact hole 603.

The PN junction is formed by adding an N+ dopant in the vicinity of the bit line metal contact hole 603 thereby forming a PN diode. In a complementary metal-oxide silicon (CMOS) process this N+ dopant is "free" since the NMOS transistors must use N+ dopant for their source and drain regions. Some of the same N+ dopant may be put near the contact hole for the bit line to form the blocking diode.

Figure 7A:
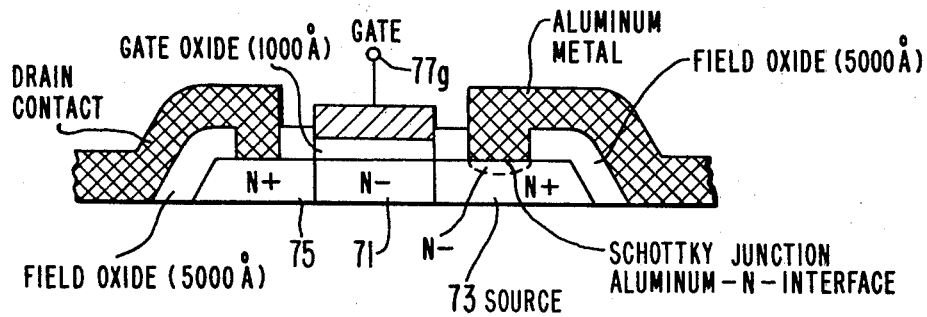
FIGS. 7A and 7B are cross sectional and schematic representation, respectively, of a deep depletion transistor and a Schottky diode which may be used to practice the invention.
Figure 7B:
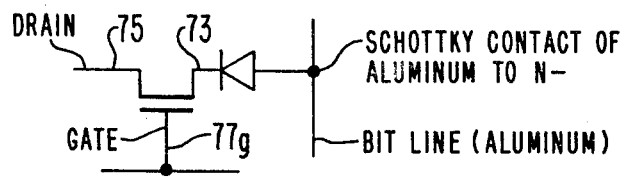

With respect to the area required, a very efficient "pass"-transistor-blocking-diode combination may be formed where the pass transistor is a deep depletion N-type IGFET as shown in FIGS. 7A and 7B.

As shown in FIG. 7A, an N-type deep depletion IGFET may be formed on an N-silicon substrate (channel bulk) region 71 with N+ diffused regions 73 and 75 forming the source and drain. The transistor also has a gate electrode 77g separated from the channel region by a dielectric material (usually SiO2). An N- pocketed is formed along the top surface of region 73 and the Schottky junction is formed by making an aluminum (metal) contact to the lightly doped (i.e. high resistivity) N- pocket. This metal to N- pocket contact forms the Schottky junction with the metal being the anode and the N-silicon being the cathode ends of the diode. It is also possible to form an N+ region in the portion of region 73 between the right hand edge of the gate region and the left hand edge of the metal to N- contact region. It is also possible to build a device without an N+ region in the source region 73 of FIG. 7A. Region 73 would be N or N- material and an aluminum to N- contact would be formed. This would result in a highly degraded transistor characteristic (i.e. a very resistive source region which would distort the standard current voltage (I-V) characteristics) but a transistor, none the less, with a diode in series with its conduction path.

The deep depletion transistor is turned off when a voltage of zero volts is applied to its gate. Due to the metal (gate-to-semiconductor) work function difference the region beneath the gate is depleted of electrons such that no drain-to-source current ($I_{DS}$) will flow. However, when the transistor is turned off the substrate 71 becomes similar to a P-type region, and source-to-substrate current can flow as described above for the PNP or NPN type IGFETs. The deep depletion transistor is known in the art and need not be detailed. Suffice it to say that it behaves like a standard enhancement IGFET of like conductivity.

In the FIGURES diodes have been used as the unidirectional conducting element to block source-to-substrate current and hence isolate the substrate capacitance. It should be appreciated that other suitable unidirectional conducting elements could be used instead.

What is claimed is:

1. In combination with an insulated-gate field-effect transistor having source and drain regions spaced apart by a substrate region, and wherein said source region forms a first junction with said substrate region and said drain region forms a second junction with said substrate region, said first and second junctions being poled to conduct current in opposite direction and wherein said substrate region is electrically floating, the improvement comprising:

a unidirectional conducting element connected to said source region, said unidirectional conducting element being poled to conduct in a direction opposite to the direction of said source-to-substrate junction.

2. In the combination as claimed in claim 1 the improvement further comprising:

an input terminal;

means for applying a signal to said input terminal; and means connecting said unidirectional conducting element to said input terminal for providing a relatively low impedance conduction path between said input terminal and said source region for the one value of input signal tending to reverse bias the source-to-substrate junction and for providing a high impedance conduction path between said input terminal and said source for that value of input signal tending to forward bias the source-to-substrate junction.

3. The combination as claimed in claim 2 wherein said unidirectional conducting element is a Schottky diode.

4. The combination as claimed in claim 2 wherein said unidirectional conducting element is a PN junction.

5. In the combination claimed in claim 1 wherein said source and drain regions are of one of P and N conductivity type and said substrate region is of the other one of said P and N conductivity type; and wherein said source region forms a first PN junction with said substrate and said drain region forms a second PN junction with said substrate.

6. In the combination as claimed in claim 5 wherein said unidirectional conducting element is a region of the other one of said P and N conductivity type.

7. The combination comprising:

a storage element having an input-output (I/O) point to which is applied data to be stored and from which is extracted data to be sensed;

an insulated-gate field-effect transistor (IGFET) having source and drain regions separated by a substrate region, said source and drain regions forming respective junctions with said substrate, poled to conduct in opposite directions and said substrate being electrically floating;

means directly connecting one of said source and drain regions to said input/output point;

a bit line;

means coupled between the other one of said source and drain regions of said IGFET and said bit line, said means including a unidirectional conducting element poled to conduct in the opposite direction than the junction formed between said other one of said source and drain regions and said substrate.

8. The combination as claimed in claim 7 wherein said source, drain and substrate regions of said IGFET are formed on a layer of insulating material.

9. The combination as claimed in claim 8 wherein said unidirectional conducting element is a diode.

10. The combination as claimed in claim 9 wherein said storage element includes a second input-output point at which is produced a signal which is the complement, of the signal at said input-output point;

further including a second IGFET and a second bit line and second means coupled between the other one of said source and drain regions of said second IGFET and said second bit line said second means including a unidirectional conducting element poled to conduct in the opposite direction to the direction of the junction formed between said other one of said source and drain regions of said second IGFET and said substrate of said second IGFET.

11. The combination as claimed in claim 9 further including:
(a) a second IGFET having source and drain regions of said opposite conductivity type and a substrate of said one conductivity type;
(b) means directly connecting one of said source and drain regions of said second IGFET to said input output point; and
(c) means connected between the other one of said source and drain regions of said second IGFET and said bit line, said second means including a unidirectional conducting element poled to conduct in the opposite direction to the direction of conduction of the junction formed between said other one of said source and drain regions and said substrate of said second IGFET.

12. The combination as claimed in claim 10 wherein said source and drain regions of said first and second IGFETs are of one of P and N conductivity type and wherein said substrate region of said first and second IGFET is of the other one of said P and N conductivity type.

13. The combination as claimed in claim 12 wherein each one of said unidirectional conducting elements includes a region of said other one of said P and N conductivity type forming a PN junction with the source region of its associated IGFET.

14. The combination as claimed in claim 11 wherein each one of said unidirectional conducting elements includes a region of said other one of said P and N conductivity type forming a PN junction with the source region of its associated IGFET.

15. In a memory system which has a common bit line, a plurality of memory cells each connected to the bit line by a gating transistor where each gating transistor includes source, drain, and substrate regions and a gate electrode, with capacitance ($C_{SB}$) between the source and substrate regions, capacitance ($C_{BD}$) between the substrate and drain regions, capacitance ($C_{BG}$) between the substrate and gate electrode, a diode ($D_{SB}$) between the source and substrate regions, and a diode ($D_{BD}$) between the substrate and drain regions, and where when it is desired to read the contents of a memory cell its associated gating transistor is turned on and all the other gating transistors are turned off and the time required for current from the selected cell to pass through the turned-on gating transistor to charge the bit line to a desired threshold level indicative of the value of the information stored in the selected cell is affected by the charge stored in the capacitances of the turned-off gating transistors, an improvement for reducing the effect of the capacitances of the non-selected cells on the read out time of the selected cell comprising:

a diode connected in series with each gating transistor between the common bit line and the source electrode of the gating transistor, said diode being poled in a direction opposite to the $D_{SB}$ diode of its associated gating transistor.

* * * * *

UNITED STATES PATENT AND TRADEMARK OFFICE
CERTIFICATE OF CORRECTION

PATENT NO. : 4,253,162

DATED : February 24, 1981

INVENTOR(S) : Richard James Hollingsworth

It is certified that error appears in the above-identified patent and that said Letters Patent is hereby corrected as shown below:

Col. 4, line 60 after "P3ai" insert --- . Diode Dbi ---.

Col. 6, line 12 "FIG. 1" should be --- FIG. 2 ---.

Col. 6, line 56 "(Wi)" should be --- ($\overline{Wi}$) ---.

Signed and Sealed this

Fourteenth Day of July 1981

[SEAL]

Attest:

Attesting Officer

GERALD J. MOSSINGHOFF

Commissioner of Patents and Trademarks